United States Patent [19]
Langley

[11] Patent Number: 5,217,926
[45] Date of Patent: Jun. 8, 1993

[54] METHOD OF PASSIVATING A SEMICONDUCTOR WAFER

[75] Inventor: Rodney Langley, Boise, Id.
[73] Assignee: Micron Technology, Inc., Boise, Id.
[21] Appl. No.: 825,654
[22] Filed: Jan. 23, 1992
[51] Int. Cl.$^5$ .......................................... H01L 21/469
[52] U.S. Cl. .................................. 437/228; 437/231; 156/643
[58] Field of Search ................. 437/228, 231; 156/643

[56] References Cited

U.S. PATENT DOCUMENTS

| | | | |
|---|---|---|---|
| 4,520,041 | 5/1985 | Aoyama et al. | 437/228 |
| 4,775,550 | 10/1988 | Chu et al. | 437/231 |
| 4,946,550 | 8/1990 | Van Laarhoven | 156/651 |
| 4,986,878 | 1/1991 | Malazgirt et al. | 437/228 |
| 5,077,234 | 12/1991 | Scoopo et al. | 437/228 |

OTHER PUBLICATIONS

S. Wolf, *Silicon Processing for the VLSI Era*, Volz, Lattice Press, Sunset Beach, CA, 1990, pp. 222-229, 233-235.

Primary Examiner—Brian E. Hearn
Assistant Examiner—Laura M. Holtzman
Attorney, Agent, or Firm—Wells, St. John, Roberts, Gregory & Matkin

[57] ABSTRACT

Disclosed is a method of passivating a semiconductor wafer having an array of substantially parallel conductive metal runners which are predominantly spaced a defined distance apart relative to adjacent runners throughout the array and which have a predominant height throughout the array. The method includes, a) depositing a first layer of a passivation dielectric insulating material atop the wafer to a selected maximum thickness between the metal runners, the selected maximum thickness being less than the defined distance between adjacent metal runners; b) depositing a layer of photoresist atop the wafer to a selected thickness sufficient to cover the first passivation layer elevationally above the metal runners; c) etching the photoresist and first passivation layer to remove dielectric insulating material from above the metal runners and not remove dielectric insulating material from between the metal runners; d) stripping photoresist from the wafer; and e) depositing a second layer of a passivation dielectric insulating material atop the wafer to a selected thickness sufficient to fill all gaps between adjacent metal runners.

4 Claims, 4 Drawing Sheets

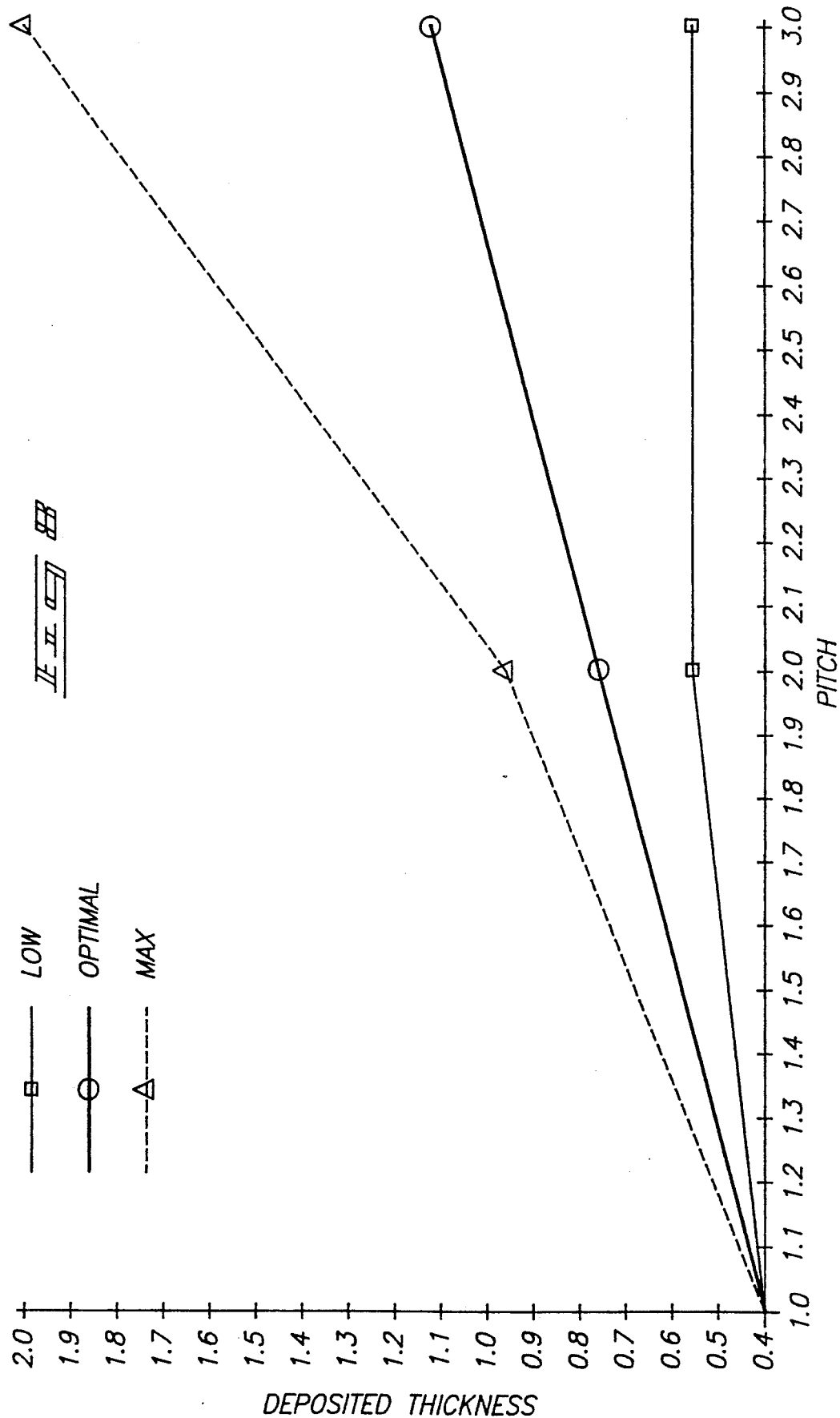

METHOD OF PASSIVATING A SEMICONDUCTOR WAFER

TECHNICAL FIELD

This invention relates to methods of applying a protective passivation layer atop a semiconductor wafer for preventing mechanical and chemical damage during assembly and packaging of individual semiconductor chips.

BACKGROUND OF THE INVENTION

The approach used in building integrated circuits on monolithic pieces of silicon involves the fabrication of successive layers of insulating, conducting, and semiconducting materials. Each layer is patterned to form a structure that performs a specific function, usually linked with surrounding areas and subsequent layers. One of the last layers put on the wafer is a final metal layer which will extend to bonding pads which will ultimately connect the chip circuitry to external devices, such as input and output devices. This metal layer is typically patterned to form an array of substantially parallel conductive runners which are predominately spaced a defined distance apart relative to adjacent runners throughout the array. Additionally, the patterned metal runners have a predominant elevation throughout the array.

Following the patterning of this final metal layer, a passivation layer is deposited over the entire top surface of the wafer. The passivation layer is an insulating and protective layer which prevents mechanical and chemical damage during assembly and packaging. The passivation layer will be finally masked and etched to define patterns corresponding to the bonding regions in which electrical contact to the finished circuit will be made.

The passivation layer preferably provides several attributes. For example, the passivation layer should be impermeable to moisture and sodium atoms, and other highly mobile impurities. It should adhere well to the conductive metal runners as well as to the dielectric layer circuits, with thicker passivation layers generally providing greater protection. It should exhibit low stress and have thermal expansion/contraction properties somewhat aligned with the underlying metal and upper inter-level dielectric. Passivation layers typically comprise one or more of doped $SiO_2$, spin-on glass (SOG), silicon nitride, oxynitride, and combinations thereof. Passivation technology is described generally in S. Wolf, "Silicon Processing for the VLSI Era", vol. 2-Process Integration, Lattice Press, Sun Beach, Calif., pp. 273-76, 1990, which is hereby incorporated by reference.

A predominant problem with prior art passivation techniques is described with reference to FIG. 1. There illustrated is a semiconductor wafer fragment 10 having a series of metal runners 12, 14 and 16 patterned across a substrate dielectric layer 18. A passivation layer 20 has been deposited atop the wafer over runners 12, 14 and 16 to a very high degree of thickness, as desired. After application of layer 20, a nitride layer such as layer 24, is typically applied. Finally, an overlying layer (not shown) of an organic/plastic-like material such as polyimide is applied atop the wafer to further encapsulate the wafer and result in an upper planer surface.

However, a phenomenon commonly referred to as the "bread-loafing effect" produces a series of voids 22 between adjacent runners within layer 20. No matter how great the thickness of passivation layer 20, voids or passageways 22 tend to be created. Such can provide stress cracks within the wafer and cause out gassing problems during subsequent wafer processing.

It would be highly desirable to provide techniques for providing thick passivating layers atop a wafer and avoid formation of voids or passageways 22.

BRIEF DESCRIPTION OF THE DRAWINGS

Preferred embodiments of the invention are described below with reference to the accompanying drawings, which are briefly described below.

FIG. 8 is a graphical representation of a first passivation layer deposition thickness as a function of separation distance between adjacent metal runners.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with the invention, a method of passivating a semiconductor wafer having an array of substantially parallel conductive metal runners which are predominantly spaced a defined distance apart relative to adjacent runners throughout the array and which have a predominant height throughout the array, comprises the following sequential steps:

depositing a first layer of a passivation dielectric insulating material atop the wafer to a selected maximum thickness between the metal runners, the selected maximum thickness being less than the defined distance between adjacent metal runners;

depositing a layer of photoresist atop the wafer to a selected thickness sufficient to cover the first passivation layer elevationally above the metal runners;

etching the photoresist and first passivation layer to remove dielectric insulating material from above the metal runners and not remove dielectric insulating material from between the metal runners;

stripping photoresist from the wafer; and depositing a second layer of a passivation dielectric insulating material atop the wafer to a selected thickness sufficient to fill all gaps between adjacent metal runners.

Where the defined distance is less than or equal to about two microns, the maximum thickness is preferably less than or equal to about 50% of the defined distance. Where the defined distance is greater than or equal to two microns, the maximum thickness is preferably from about 30% to about 50% of the defined distance. Most preferably, the maximum thickness is about 40% of the defined distance. Also, the first passivation layer is preferably etched downwardly to a thickness of from zero to about 2000 Angstroms above the upper surface of the metal runners.

Figure 1:
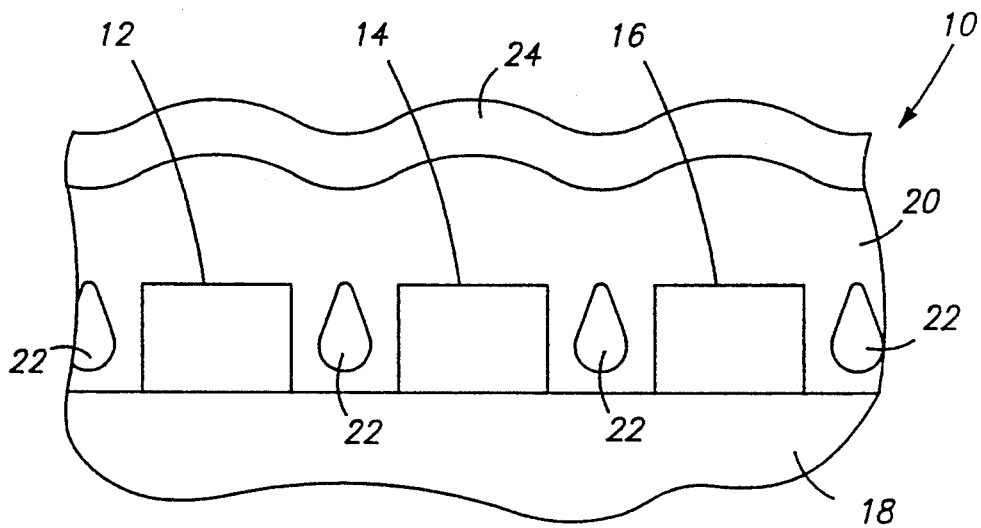
FIG. 1 is a diagrammatic section of a semiconductor wafer processed in accordance with prior art techniques, and is discussed in the "Background" section above.
Figure 2:
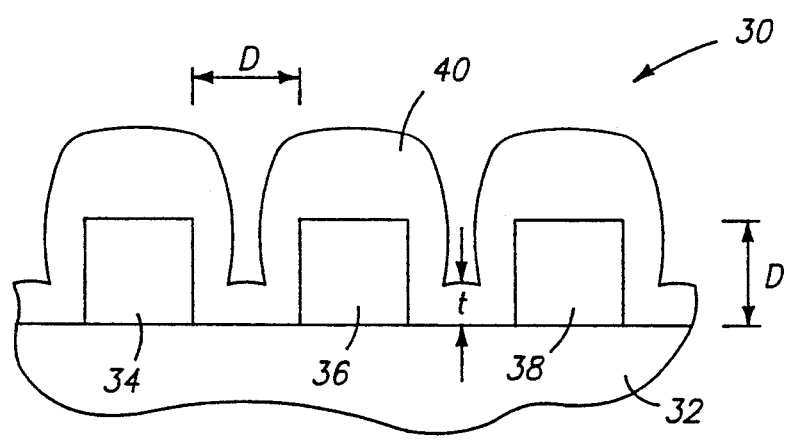
FIG. 2 is a diagrammatic section of a semiconductor wafer at one processing step in accordance with the invention.

The discussion proceeds in more detail with reference to FIGS. 2-8 for a description of a preferred embodiment method in accordance with the invention. FIG. 2 illustrates a semiconductor wafer fragment 30 comprised of a substrate or insulating layer 32 atop which an array of substantially parallel conductive metal runners 34, 36 and 38 are provided. Such runners are spaced relative to one another a defined distance "D" throughout the array and have a predominant height "D" throughout the array.

A first layer 40 of a passivation dielectric insulating material is deposited atop wafer 30 to a selected maximum thickness "t" between adjacent metal runners. Such selected maximum thickness "t" is less than defined distance "D" between adjacent metal runners. Most preferably, thickness "t" is approximately 40% of the distance between adjacent metal runners. Preferably, insulating dielectric material of layer 40 comprises $SiO_2$ deposited by decomposition of TEOS.

Table 1 below indicates preferred thickness ranges for "t" as a function of the defined distance or pitch "D", and the percentage of thickness range "t" of defined pitch "D". The thickness and pitch defined in Table 1 are for an array of one micron high metal runners. For runners which are 0.5 microns in height, the preferred thickness ranges for the given pitch will be exactly half the stated values. For a metal runner thickness equal to two microns, the preferred thickness ranges for a given pitch will be exactly twice that illustrated in Table 1.

TABLE 1

| Pitch "D" | Preferred Thickness Range | Low percent/High % |
|---|---|---|
| 0.8 | .36-.4 | 45%-50% |
| 1.0 | .4-.5 | 40%-50% |
| 1.3 | .45-.65 | 35%-50% |
| 1.6 | .51-.8 | 32%-50% |
| 2.0 | .6-1.0 | 30%-50% |
| 2.2 | .6-1.2 | 27%-55% |
| 2.5 | .6-1.5 | 24%-60% |
| 2.7 | .6-1.7 | 22%-63% |
| 3.0 | .6-2.0 | 20%-67% |

Table 2 below illustrates the most preferred thicknesses as a function of pitch for one micron high metal runners.

TABLE 2

| Pitch "D" | Most Preferred Thickness | % |
|---|---|---|
| 1.0 | .4 | 40% |
| 1.3 | .52 | 40% |
| 1.6 | .64 | 40% |
| 2.0 | .8 | 40% |
| 2.2 | .88 | 40% |
| 2.5 | 1.0 | 40% |
| 2.7 | 1.08 | 40% |
| 3.0 | 1.2 | 40% |

The data of Tables 1 and 2 is graphically illustrated in FIG. 8.

Figure 3:
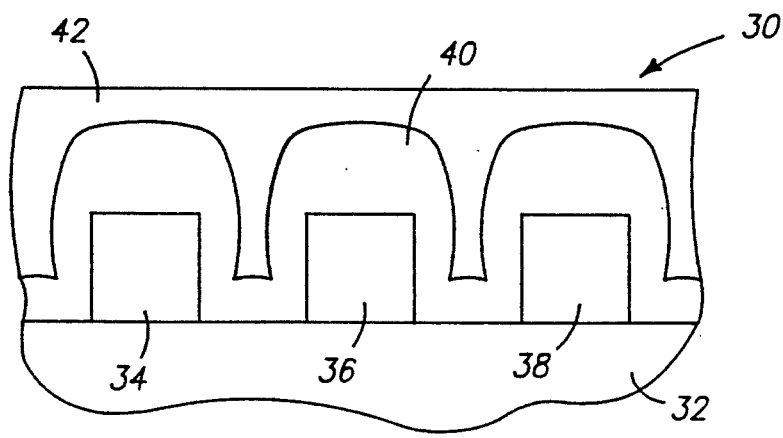
FIG. 3 is a diagrammatic section of the FIG. 2 wafer illustrated at a processing step subsequent to that shown by FIG. 2.

Referring to FIG. 3, a layer 42 of photoresist is deposited atop wafer 30 to a selected thickness sufficient to cover first passivation layer 40 elevationally above metal runners 34, 36 and 38. Photoresist 42 and first passivation layer 40 are etched to remove dielectric insulating materials from above the metal runners and not remove dielectric insulating material from between the metal runners.

Figure 4:
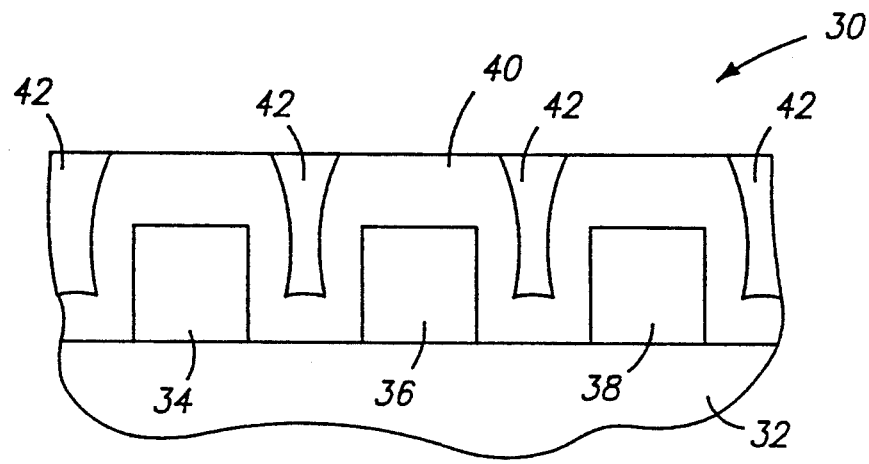
FIG. 4 is a diagrammatic section of the FIG. 2 wafer illustrated at a processing step subsequent to that shown by FIG. 3.

More specifically and with reference to FIG. 4, photoresist layer 42 is preferably first etched to a point where first passivation layer 40 is upwardly exposed, as shown. An example chemistry which would provide the indicated etch would be fluorine gas chemistry in combination with $O_2$. Example fluorine containing gases are $C_2F_6$, $CF_4$, and $NF_3$. Such chemistries have a tendency to etch photoresist and oxide at substantially the same rate. Alternately, an $O_2$ plasma etch could be conducted to etch photoresist 42 selectively relative to oxide layer 40, thereby just exposing the upper surfaces of oxide layer 40.

Figure 5:
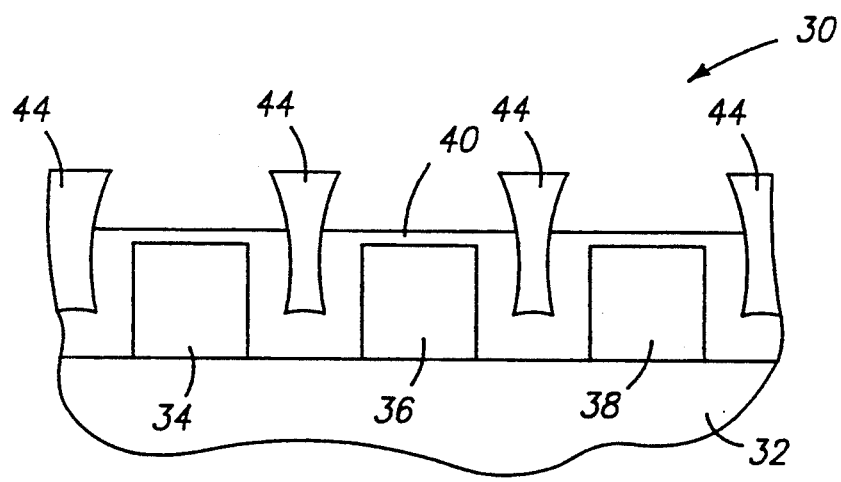
FIG. 5 is a diagrammatic section of the FIG. 2 wafer illustrated at a processing step subsequent to that shown by FIG. 4.

Referring to FIG. 5, first passivation layer 40 is then selectively etched relative to photoresist layer 42, thus leaving photoresist pillars 44. An example chemistry for doing such, as would be known to people with skill in the art, would include a combination of $CF_4$ and $CHF_3$. Preferably, first passivation layer 40 is etched downwardly to a thickness of from zero to about 2000 Angstroms above the common upper surface of metal runners 34, 36 and 38.

Figure 6:
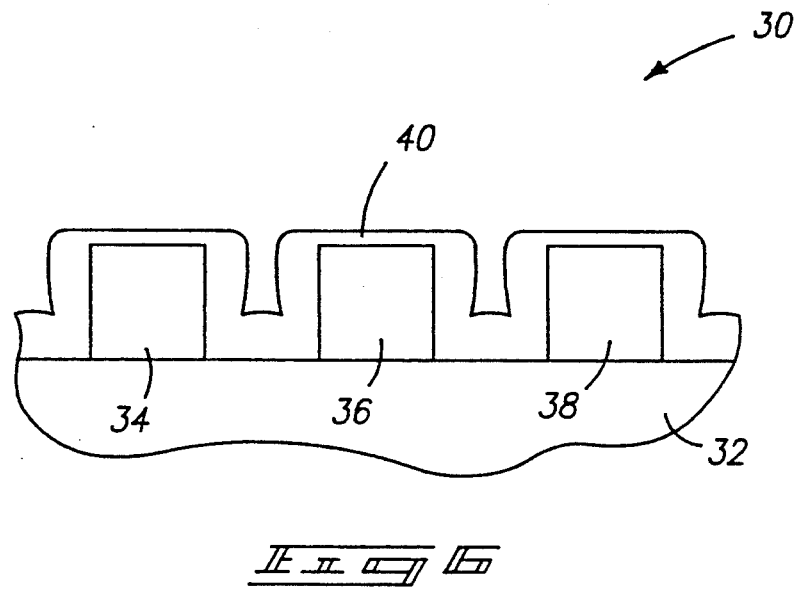
FIG. 6 is a diagrammatic section of the FIG. 2 wafer illustrated at a processing step subsequent to that shown by FIG. 5.

Referring to FIG. 6, photoresist layer 42 is stripped from the wafer.

Figure 7:
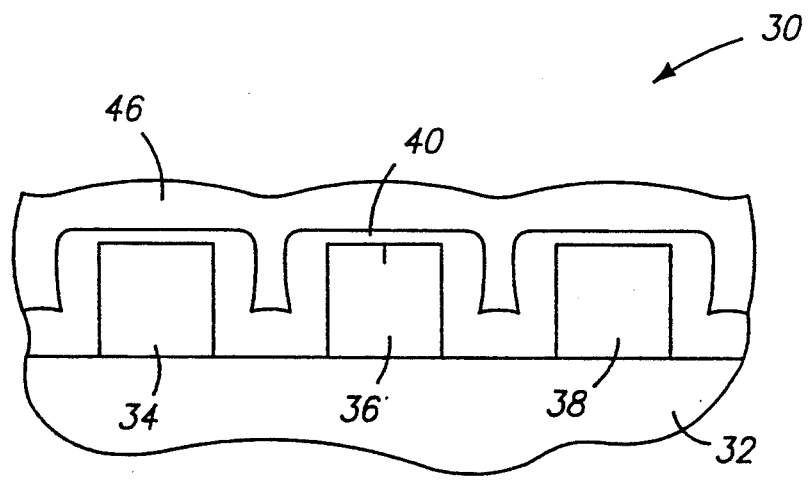
FIG. 7 is a diagrammatic section of the FIG. 2 wafer illustrated at a processing step subsequent to that shown by FIG. 6.

Referring to FIG. 7, a second layer 46 of a passivation dielectric insulating material, such as $SiO_2$, is deposited atop wafer 30 to a selected thickness sufficient to fill all gaps between adjacent metal runners. Subsequent nitride and polyimide layers would then preferably be applied.

Such partial filling of the area between the runners initially minimizes or eliminates the sharp stress points, and bread loafing effect, thereby enabling the prior art voids or passageways between metal runners to be eliminated. Such has the advantage of reducing stresses in the typical overlying nitride layer which is thereafter applied.

In compliance with the statute, the invention has been described in language more or less specific as to methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of passivating a semeconductor wafer having an array of substantially parallel conductive metal runners which are predominantly spaced a defined distance apart relative to adjacent runners throughout the array and which have a predominant height throughout the array, the detined distance being greater than or equal to about 2 microns, the method comprising the following sequential steps:

depositing a first layer of a passivation dielectric insulating material atop the wafer to a selected maximum thickness between the metal runners, the selected maximum thickness being from about 30% to about 50% of the defined distance between adjacent metal runners;

depositing a layer of photoresist atop a wafer to a selected thickness sufficient to cover the first passivation layer elevationally above the metal runners;

etching the photoresist and first passivation layer to remove dielectric insulating material of the first passivation layer from above the metal runners and not remove dielectric insulating material of the first passivation layer from between the metal runners;

stripping remaining photoresist from the water; and depositing a second layer of a passivation dielectric insulating material atop the wafer to a selected thickness sufficient to fill all gaps between adjacent metal runners.

2. A method of passivating a semiconductor water having an array of substantially parallel conductive metal runners which are predominantly spaced a defined distance apart relative to adjacent runners throughout the array, the defined distance being greater than or equal to about 2 microns, the method comprising the following sequential steps.

depositing a first layer of a passivation dielectric insulating material atop the wafer to a selected maximum thickness between the metal runners, the selected maximum thickness being from about 30% to about 50% of the defined distance between adjacent metal runners;

depositing a layer of photoresist atop the wafer to a selected thickness sufficient to cover the first passivation layer elevationally above the metal runners;

etching the photoresist and first passivation layer to remove dielectric insulating material from above the metal runners and not remove dielectric insulating material from between the metal runners, such etching including etching the photoresist to a point where the first passivation layer is upwardly exposed, and then etching the first passivation layer selectively relative to the photoresist;

stripping photoresist from the wafer; and depositing a second layer of a passivation dielectric insulating material atop the wafer to a selected thickness sufficient to fill all gaps between adjacent metal runners.

3. A method of passivating a semiconductor water having array of substantially parallel conductive metal runners which are predominantly spaced a defined sistance apart relative to adjacent throughout the array and which have a predominant height throughout the array, the defined distance being greater than or equal to about 2 microns, the method comprising the following sequential steps:

depositing a first layer of a passivation dielectric insulating material comprising SiO2 atop the wafer to a selected maximum thickness between the metal runners, the selected maximum thickness being from about 30% to about 50% of the defined distance between adjacent metal runners;

depositing a layer of photoresist atop a wafer to selected thickness sufficient to cover the first passivation layer elevationally above the metal runners;

etching the photoresist and first passivation layer to remove dielectric insulating material of the passivation layer from between the metal runners;

stripping remaining photoresist from the wafer; and depositing a second layer of a passivation dielectric material atop the wafer to a selected thickness sufficient to fill all gaps between adjacent metal runners.

4. A method of passivating a semiconductor wafer having an array of substantially parallel conductive metal runners which are predominantly spaced a defined distance apart relative to adjacent runners throughout the array and which have a predominant height throughout the array, the defined distance being greater than or equal to about 2 microns, the method comprising the following sequential steps:

depositing a first layer of a passivation dielectric insulating material atop the wafer to a selected maximum thickness between the metal runners, the selected maximum thickness being from about 30% to about 50% of the defined distance between adjacent metal runners, the maximum thickness being less than the predominant height;

depositing a layer of photoresist atop the water to a selected thickness sufficient to cover the first passivation layer elevationally above the metal runner;

etching the photoresist and first passivation layer to remove dielectric insulating material of the first passivation layer from above the metal runners and not remove dielectric insulating material of the first passivation layer from between the metal runners;

stripping remaining photoresist from the wafer; and depositing a second layer of a passivation dielectric insulating material atop the wafer to a selected thickness sufficient to fill all gaps between adjacent metal runners.

* * * * *